(12) United States Patent
Hou et al.

(10) Patent No.: US 7,782,154 B2
(45) Date of Patent: Aug. 24, 2010

(54) POWER AMPLIFIER AND MODULATOR THEREOF

(75) Inventors: Hsin-Hong Hou, Taipei County (TW); Chung-Wei Lin, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 88 days.

(21) Appl. No.: 12/340,744

(22) Filed: Dec. 22, 2008

(65) Prior Publication Data

US 2010/0123518 A1 May 20, 2010

(30) Foreign Application Priority Data

Nov. 19, 2008 (TW) ............................. 97144754 A (51) Int. Cl.
*H03K 7/08* (2006.01)
*H03M 3/00* (2006.01)
(52) U.S. Cl. ...................................... 332/109; 331/143
(58) Field of Classification Search ......... 332/109–111; 330/10; 341/143, 144, 155
See application file for complete search history.

(56) References Cited

U.S. PATENT DOCUMENTS 6,473,019 B1 * 10/2002 Ruha et al. ................... 341/143

OTHER PUBLICATIONS

Ido et al., A Digital Input Controller for Audio Class-D Amplifiers with 100W 0.004% THD+N and 113dB DR, IEEE International Solid-State Circuits Conference, Feb. 7, 2006, pp. 348-349, 658.
Article titled "New Concepts in Pulse-Width Modulation" authored by J. Vanderkooy, Presented at the 97th Convention Nov. 10-13, 1994 San Francisco.

* cited by examiner

*Primary Examiner*—David Mis
(74) *Attorney, Agent, or Firm*—Jianq Chyun IP Office (57) ABSTRACT

A power amplifier including a loop filter, a frequency generator, a quantizer, and an output stage module is provided. The frequency generator outputs a signal with a reference frequency to the loop filter, and includes a logic circuit, a current array, and a dummy load. The dummy load representing a load circuit in the loop filter is coupled to the current array. An equivalent impedance of the dummy load is proportioned to an equivalent impedance of the load circuit. The current array outputs the signal and a dummy signal to the loop filter and the dummy load, respectively, according to a logic signal. By using the frequency generator to modulate the frequency automatically, an impact on the power amplifier caused by passive devices therein due to process variationscan be reduced.

22 Claims, 12 Drawing Sheets

POWER AMPLIFIER AND MODULATOR THEREOF

CROSS-REFERENCE TO RELATED APPLICATION

This application claims the priority benefit of Taiwan application serial no. 97144754, filed on Nov. 19, 2008. The entirety of the above-mentioned patent application is hereby incorporated by reference herein and made a part of this specification.

BACKGROUND OF THE INVENTION

1. Field of the Invention

The present invention relates generally to a power amplifier and a modulator thereof, and more particularly, to a sigma-delta pulse-width modulation class-D power amplifier with an automatic frequency modulation function and a modulator thereof.

2. Description of Related Art

Power amplifiers can be classified into many types based on their applications, such as class-A, class-B, class-AB, class-C, class-D, and so on. For example, the class-D power amplifiers are being widely used in audio signal processing of handheld and mobile devices due to their high power conversion efficiencies (higher than 90%). Some class-D amplifiers utilize a pulse width modulator to generate a continuous pulse where the pulse widths vary with the amplitude of audio signals to control operation of a switching circuit in the class-D power amplifiers. However, the performance of the class-D power amplifiers on those products that are rather reluctant to have a high signal distortion is not as good as that of the class-AB power amplifiers.

In order to prevent nonlinear distortion of the output signal of the class-D power amplifier, a sigma-delta class-D power amplifier has therefore been proposed which can ensure a lower signal distortion than the class-AB power amplifier while the high power conversion efficiency of the class-D power amplifier is still maintained. This makes the sigma-delta class-D power amplifiers very competitive in the market. However, the sigma-delta class-D power amplifier has a critical shortcoming, i.e., when the input signal becomes larger to a certain extent, typically a half of a reference level, the total harmonic distortion plus noise (THD+N) of the sigma-delta class-D power amplifier will rise sharply. The term THD+N used herein is defined as a ratio of the sum of the powers of all the harmonic distortion signals presented by the device itself and noises to the output power.

In order to overcome the critical shortcoming of the sigma-delta class-D power amplifier, a sigma-delta pulse-width modulation class-D power amplifier has been developed accordingly. The sigma-delta pulse-width modulation class-D power amplifier can overcome the sharp rise problem of the THD+N of the sigma-delta class-D power amplifier while the power conversion efficiency can still be maintained in common power applications. In addition, this technology utilizes the principle of continuous-time sigma-delta modulation. Therefore, passive components, such as, resistors, capacitors, and so forth, are required in a loop filter circuit.

However, due to limitations in the fabrication technology, the absolute values of the passive components have a variation of about ±20%~±40%, which significantly affects the circuit performance. The process variations of the passive components cannot be precisely controlled such that the circuit performance variation caused by the variation of the absolute values of the passive components can be unduly large. As a result, the output signal quality of the sigma-delta pulse-width modulation class-D power amplifier cannot be effectively increased.

SUMMARY OF THE INVENTION

Embodiments of the present invention provide a modulator including a loop filter, a frequency generator and a quantizer. The loop filter is used to calculate a difference between an input signal and an output signal, accumulate the difference, and generate a first signal according to the difference and a reference frequency. The frequency generator provides a second signal with the reference frequency to the loop filter. The quantizer is coupled to the loop filter for quantizing the first signal into a digital signal and outputting the digital signal to a next stage circuit of the modulator. The frequency generator includes a logic circuit, a current array and a dummy load. The logic circuit is used to receive a third signal, compare a level of the third signal with a level of a first reference signal or a second reference signal, and output a logic signal. The current array is coupled to the logic circuit and generates the second signal and a dummy signal according to the logic signal. The second signal and the dummy signal are related to each other. The dummy load representing a load circuit of the loop filter is coupled to the current array. The current array uses the dummy signal to drive the dummy load to provide a third signal to the logic circuit.

Embodiments of the present invention provide a power amplifier including a loop filter, a frequency generator, a quantizer and an output stage module. The loop filter is used to calculate a difference between an input signal and an output signal, accumulate the difference, and generate a first signal according to the difference and a reference frequency. The frequency generator provides a second signal with the reference frequency to the loop filter. The quantizer is coupled to the loop filter for quantizing the first signal into a digital signal and outputting the digital signal to a next stage circuit of the modulator. The output stage module is coupled to the quantizer for receiving the digital signal and generating the corresponding output signal according to a logic level of the digital signal to drive an external load. In addition, the frequency generator includes a logic circuit, a current array and a dummy load. The logic circuit is used to receive a third signal, compare a level of the third signal with a level of a first reference signal or a second reference signal, and output a logic signal. The current array is coupled to the logic circuit and generates the second signal and a dummy signal according to the logic signal. The second signal and the dummy signal are related to each other. The dummy load representing a load circuit of the loop filter is coupled to the current array. The current array uses the dummy signal to drive the dummy load to provide a third signal to the logic circuit.

In view of the foregoing, the present invention employs the frequency generator which properly modulates a frequency and outputs the modulated frequency to the loop filter. As such, the frequency generator properly modulating the frequency can reduce the impact on the power amplifier caused by the passive components in the loop filter due to process variations, thereby maintaining a high performance of the power amplifier.

In order to make the aforementioned and other features and advantages of the present invention more comprehensible, embodiments accompanied with figures are described in detail below.

DESCRIPTION OF THE EMBODIMENTS

Figure 1:
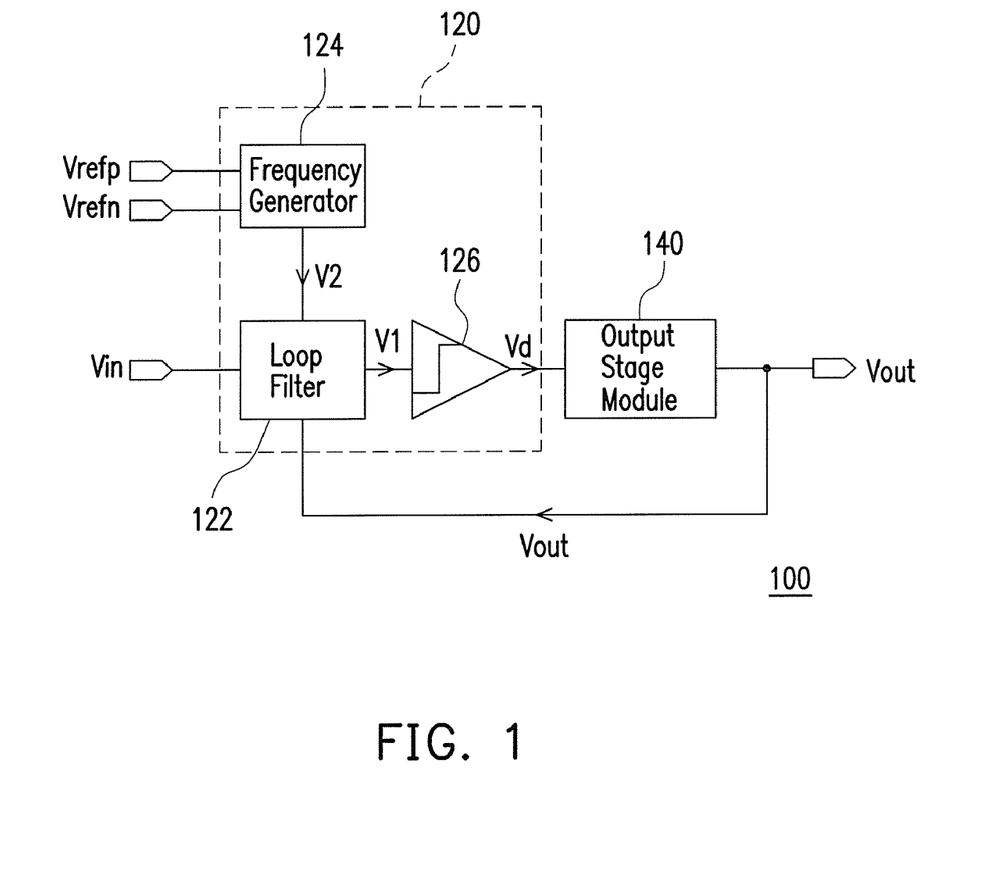
FIG. 1 is a block diagram of a power amplifier according to one embodiment of the present invention.

FIG. 1 is a block diagram of a power amplifier according to one embodiment of the present invention. As shown in FIG. 1, the power amplifier 100 includes a modulator 120 and an output stage module 140. The modulator 120 includes a loop filter 122, a frequency generator 124, and a quantizer 126.

Specifically, the loop filter 122 receives an input signal Vin and an output signal Vout outputted from the output stage module 140 and accumulates a different difference between the input signal Vin and the output signal Vout after the difference is calculated. The loop filter 122 outputs a first signal V1 to the quantizer 126 according to the calculated difference and a reference frequency fs of a second signal V2 provided by the frequency generator 124.

Afterwards, the quantizer 124 coupled to the loop filter 122 quantizes the first signal V1 into a digital signal Vd, and outputs the digital signal Vd to the output stage module 140. Upon receiving the digital signal Vd, the output stage module 140 generates the corresponding output signal Vout to drive an external load (not shown) according to a logic level of the digital signal Vd, and provides a feedback signal of the output signal Vout back to the loop filter 122.

In the present embodiment, the quantizer 124 is, for example, a comparator for quantizing the first signal V1 outputted from the loop filter 122 into the digital signal Vd. The logic level of the digital signal Vd corresponds to one of two quantization states such as "1" and "−1".

Figure 2:
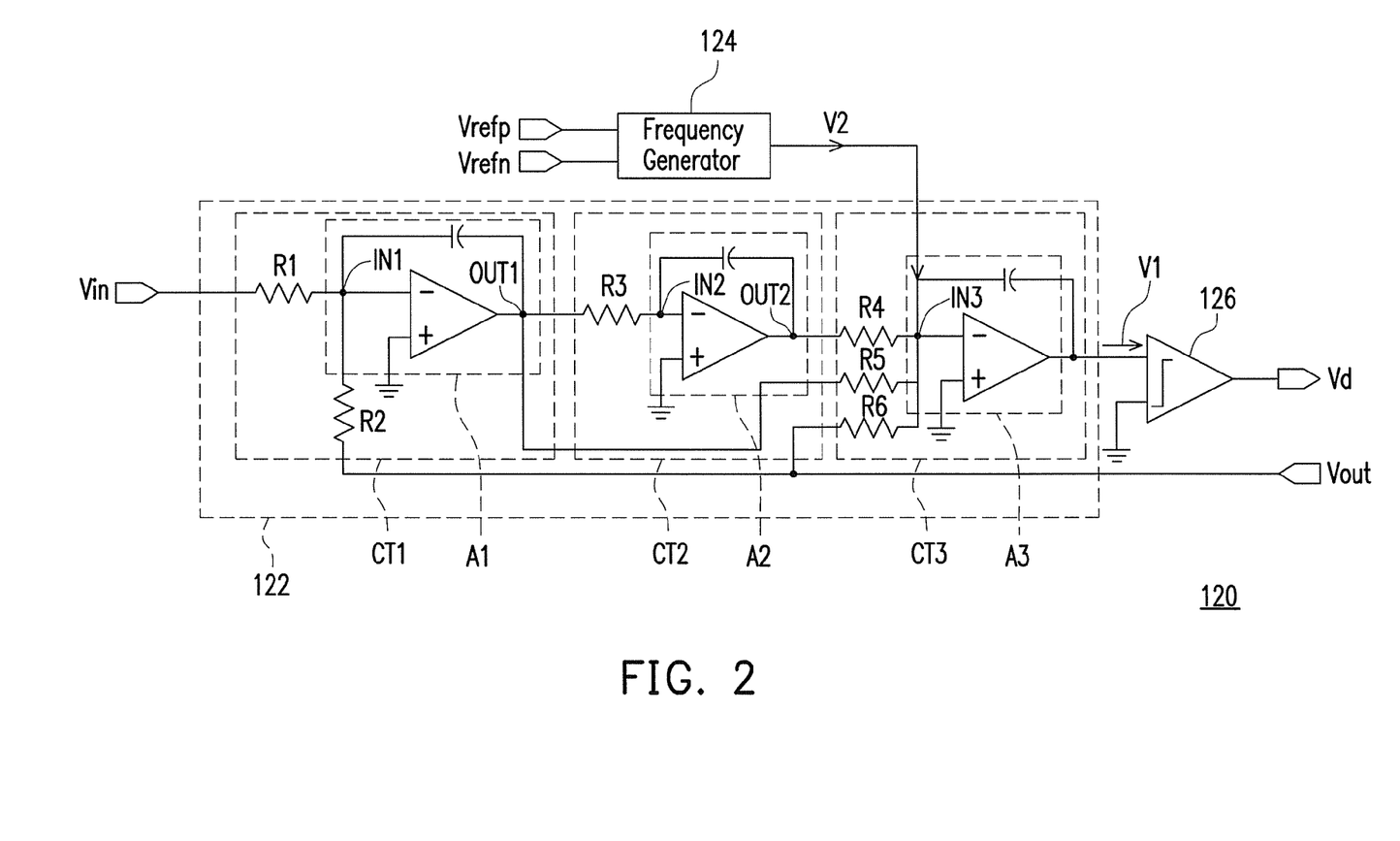
FIG. 2 is a circuit diagram of the loop filter according to one embodiment of the present invention.

FIG. 2 is a circuit diagram of the loop filter according to one embodiment of the present invention. As shown in FIG. 2, the loop filter 122 of the present embodiment is formed by three continuous-time modulators CT1, CT2, and CT3 based on the principle of continuous-time modulation.

Specifically, the loop filter 122 includes integrators A1~A3 and resistors R1~R6. A negative input end IN1 of the integrator A1 is coupled to one end of the resistor R1, and the other end of the resistor R1 receives an input signal Vin. In addition, the negative input end IN1 of the integrator A1 is further coupled to one end of the second resistor R2, and the other end of the resistor R2 receives the feedback signal (i.e., the output signal Vout) from the output stage module 140 (as shown in FIG. 1). A negative input end IN2 of the integrator A2 is coupled to an output end OUT1 of the integrator A1 via the resistor R3.

Similarly, a negative input end IN3 of the integrator A3 is coupled to output ends OUT1 and OUT2 of the integrators A1 and A2 via the resistors R5 and R4, respectively. In addition, the negative input end IN3 of the integrator A3 receives the output signal Vout from the output stage module 140 (as shown in FIG. 1) via the resistor R6.

Figure 3:
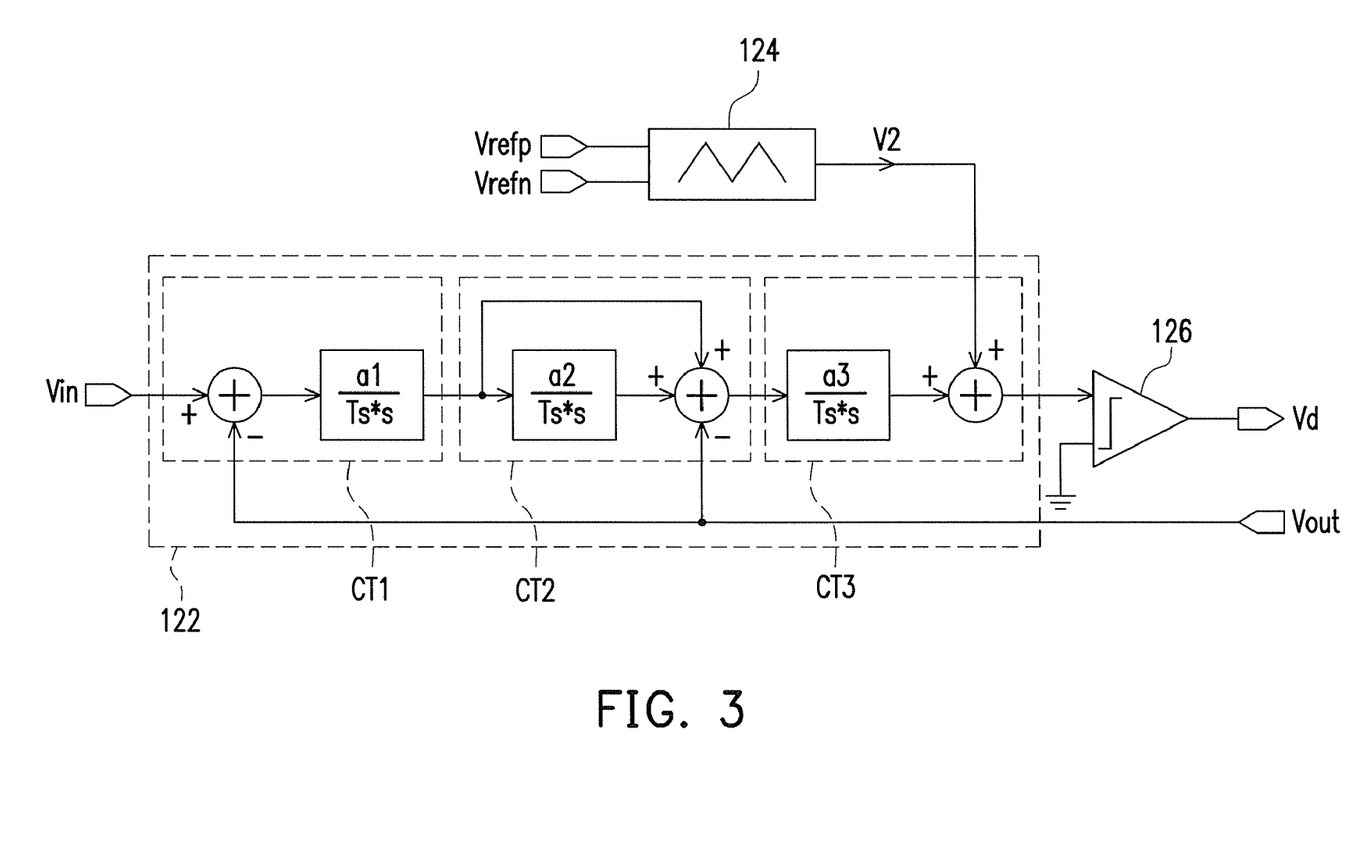
FIG. 3 is a behavior model of the loop filter of FIG. 2.

FIG. 3 is a behavior model of the loop filter of FIG. 2. Referring to FIGS. 2 and 3, it can be seen from FIG. 3 that s-domain behavior models of the continuous-time modulators CT1, CT2, and CT3 of the present embodiment are $$\frac{a_1}{T_S \times S}, \frac{a_2}{T_S \times S},$$

and $$\frac{a_3}{T_S \times S},$$

respectively, where a1, a2, and a3 denote coefficients of the loop filter 122, s denotes a s-domain factor, and Ts denotes a reference period of the second signal V2 outputted by the frequency generator 124. In the present embodiment, the second signal V2 is, for example, a triangle wave to implement the continuous-time sigma-delta modulation. How the frequency generator 124 reduces the impact on the power amplifier 100 caused by passive components (i.e., resistors, capacitors) in the loop filter 122 due to the process variations is explained below in detail.

Figure 4:
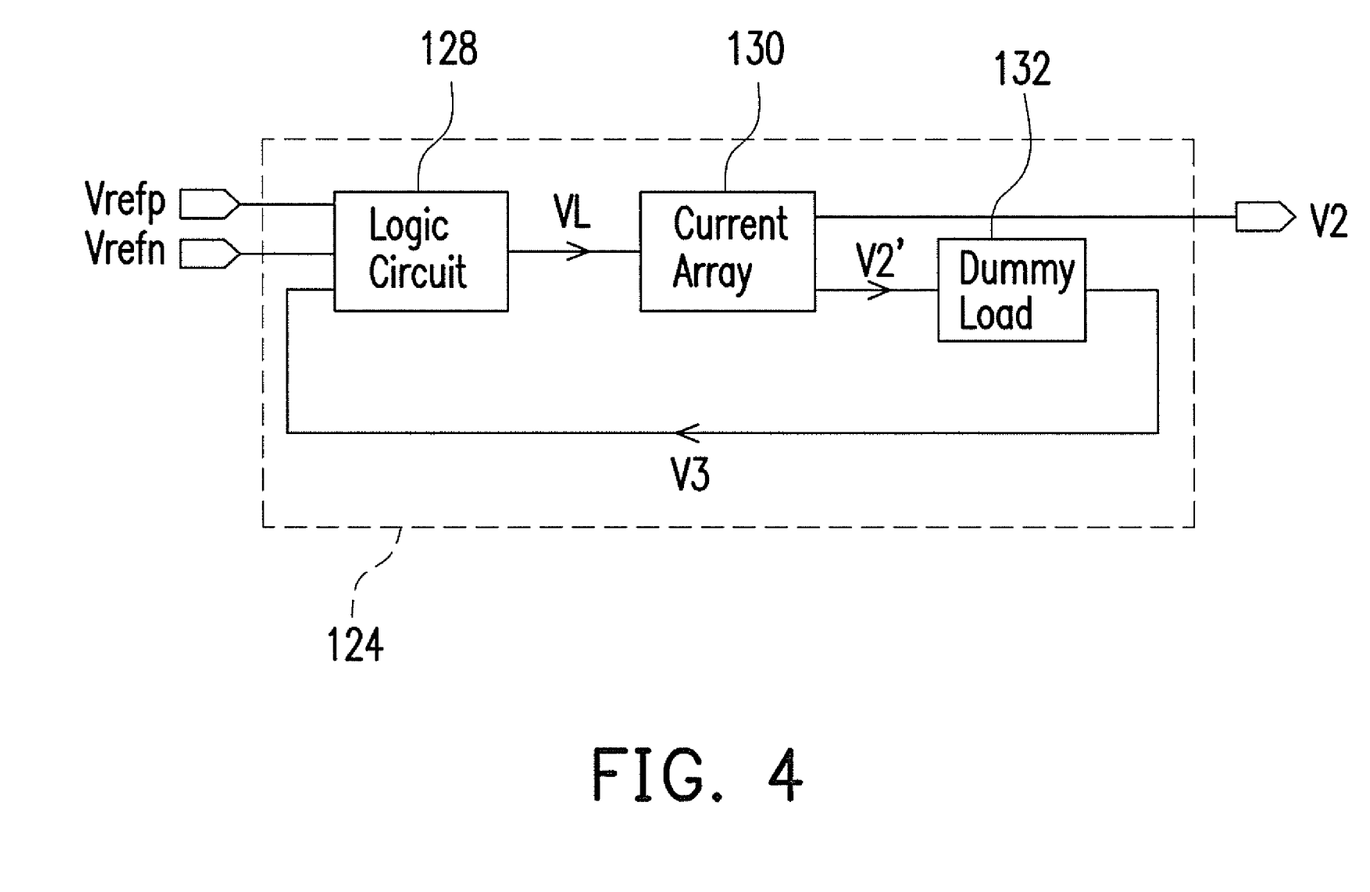
FIG. 4 is a block diagram of the frequency generator according to one embodiment of the present invention.

FIG. 4 is a block diagram of the frequency generator according to one embodiment of the present invention. As shown in FIG. 4, the frequency generator 124 includes a logic circuit 128, a current array 130, and a dummy load 132.

Specifically, the logic circuit 128 determines a logic state of a logic signal VL outputted by the logic circuit 128 by comparing a level of a third signal V3 provided by the dummy load 132 with levels of reference signals Vrefp and Vrefn. The logic level of the logic signal VL controls how the current array 130 drives the dummy load 132. In the present embodiment, the dummy load 132 is driven, for example, by extracting a current from or injecting a current into the dummy load 132. The current array 130 is coupled to the logic circuit 128 and generates the second signal V2 and a dummy signal V2' according to the logic state of the logic signal VL. In addition, the dummy load 132 represents a load circuit A3 (shown in FIG. 2) of the loop filter 122 and provides the third signal V3 to the logic circuit 128. In the present embodiment, the load circuit is, for example, the integrator A3 of the loop filter 122 of FIG. 2.

Figure 5:
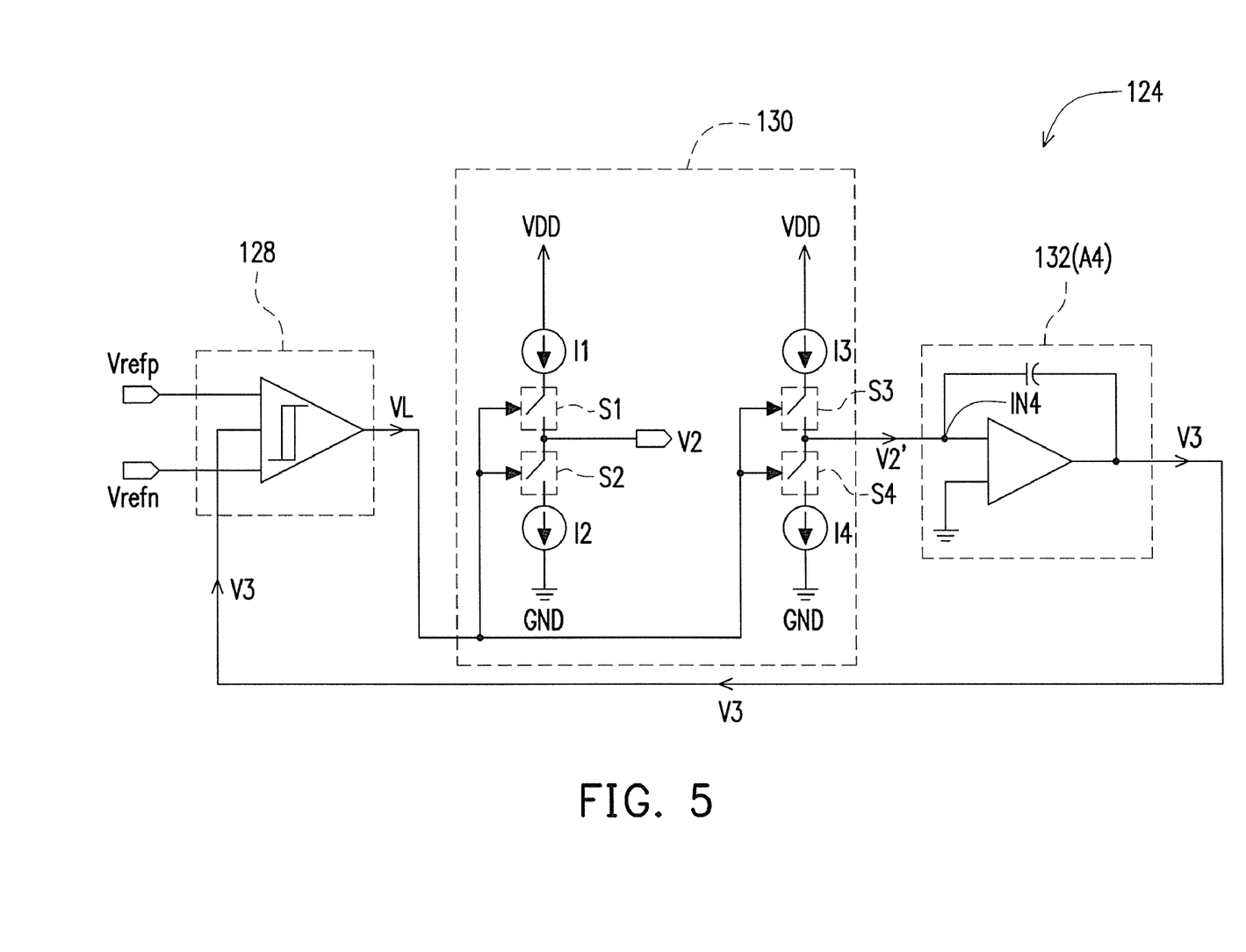
FIG. 5 is a circuit diagram of the frequency generator according to one embodiment of the present invention.

FIG. 5 is a circuit diagram of the frequency generator according to one embodiment of the present invention. As shown in FIG. 5, the current array 130 includes current sources I1~I4 and switches S1~S4. Specifically, an input end of the current source I1 is coupled to a system voltage VDD, an output end of the current source I1 is coupled to one end of the switch S1, and the other end of the switch S1 is coupled to the loop filter 122. Similarly, an input end of the current source I2 is coupled to one end of the switch S2, an output end of the current source I2 is grounded, and the other end of the switch S2 is coupled to the loop filter 122. As such, the switches S1 and S2 can be switched on or switched off by the logic state of the logic signal VL to extract a current (I2) from or inject a current (I1) into the loop filter 122.

Coupling correlations between the current sources I3, I4 and the switches S3, S4 is similar to the coupling correlations between the current sources I1, I2 and the switches S1, S2 except that one end of each switch S3 and S4 is coupled to the dummy load 132. Therefore, switch-on or switch-off of the switches S3, S4 can determine extraction of a current (I4) from or injection of a current (I3) into the dummy load 132.

Referring to FIGS. 2 and 5, the dummy load 132 of the present embodiment is, for example, an integrator A4 which provides the third signal V3 to the logic circuit 128. It is to be noted that an equivalent impedance of the integrator A4 is proportional to an equivalent impedance of the integrator A3 of the loop filter 122. In other words, an equivalent impedance of the dummy load 132 is proportional to an equivalent impedance of the load circuit of the loop filter 122.

In addition, the logic circuit 128 is, for example, a hysteresis comparator, and the logic level of the logic signal VL outputted by the logic circuit 128 is, for example, "1" when the level of the third signal V3 is higher than the level of the reference signal Vrefp. In this case, the switches S1 and S3 are switched off while the switches S2 and S4 are switched on, such that the logic circuit 128 controls the current sources I2 and I4 to extract currents from the loop filter 122 and the dummy load 132, respectively. This places the integrators A3 and A4 in a discharging state, thereby lowering the voltage of the negative input ends IN3 and IN4 of the integrators A3 and A4. On the contrary, when the level of the third signal V3 is lower than the level of the reference signal Vrefn, the logic level of the logic signal VL outputted by the logic circuit 128 is, for example, "0". In this case, the logic circuit 128 controls the current sources I1, I3 to inject currents into the loop filter 122 and the dummy load 132, respectively, thereby increasing the voltage of the negative input ends IN3 and IN4 of the integrators A3 and A4.

Figure 6:
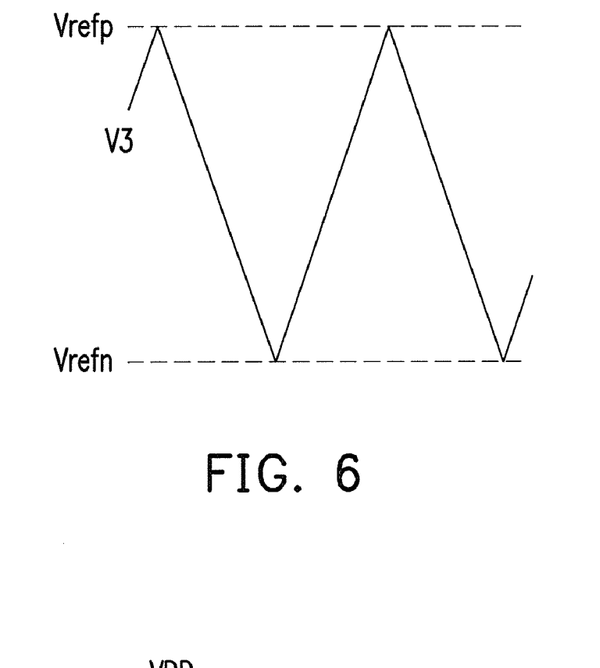
FIG. 6 is a view showing the waveform of the third signal according to one embodiment of the present invention.

FIG. 6 is a view showing the waveform of the third signal according to one embodiment of the present invention. Referring to FIGS. 2, 5 and 6, in the present embodiment, the waveform of the third signal V3 is the triangle wave as shown in FIG. 6, wherein the period of the triangle wave is Ts, the frequency is fs, and the levels of the reference signals Vrefp and Vrefn are equal to maximum and minimum levels of the triangle wave, respectively.

Assuming the voltage of the third signal V3 is lower than the level of the reference signal Vrefn at the beginning, the level of the logic signal VL would be "0" and the switches S1 and S3 would be switched on such that the current source I3 charges the dummy load 132. At the same time, the current source I3 charges the load circuit A3 of the loop filter 122. As a result, the voltage of the negative input ends IN3 and IN4 of the integrators A3 and A4 are increased. Next, when the voltage of the third signal V3 becomes higher than the level of the reference signal Vrefp, the level of the logic signal VL outputted by the logic circuit 128 changes from "0" into "1". In this case, the switches S1~S4 changes their ON/OFF states according to the logic signal VL, which places the load circuit A3 of the loop filter 122 and the dummy load 132 in the discharging state (i.e., the current sources I2 and I4 extract currents from the integrators A3 and A4), respectively, thereby lowering the voltage of the negative input ends IN3, IN4 of the integrators A3 and A4. Once the voltage of the negative input ends IN3, IN4 of the integrators A3 and A4 is lowered to the reference signal Vrefn, the current sources I1 and I3 charge the load circuit A3 of the loop filter 122 and the dummy load 132 again, respectively.

The dummy signal V2' with the frequency fs and the period Ts can thus be generated by repeatedly operating as described above. It is to be noted that the second signal V2 and the dummy signal V2' have the same frequency fs and period Ts because the logic signal VL of the logic circuit 128 acts on the switches S1~S4 simultaneously. As such, the frequency generator 124 can provide the second signal V2 with the reference frequency fs and the reference period Ts to the loop filter 122.

It can be concluded from FIGS. 2, 5 and 6 that $$T_S = \frac{C}{I}(V_{refp} - V_{refn}),$$

where C denotes the capacitance of the integrator, and I denotes the current extracted from or injected into the dummy load 132 and the load circuit A3. If it is desired to maintain constant coefficients a1, a2, a3 of the loop filter 122, then Ts=R×S, where R denotes the equivalent impedance of the loop filter 122. It can be obtained from the foregoing two equations that $$R \times S = \frac{C}{I}(Vrefp - Vrefn).$$

In view of the foregoing, the frequency generator 124 can automatically adjust the reference frequency fs and the reference period Ts of the second signal V2 inputted to the loop filter 122 by means of the logic circuit 128, the current array 130 and the dummy load 132. Therefore, the frequency generator 124 can reduce the impact on the power amplifier caused by capacitance devices in the loop filter due to the process variations.

The circuits of the loop filter 122 and the frequency generator 124 and the signal waveform of the third signal as illustrated FIGS. 2, 5 and 6 are for the purpose of description only such that those skilled in the art are enabled to practice the present invention upon reading the disclosure herein. However, this should not be used to limit the present invention. For example, in alternative embodiments, the dummy load 132 of the frequency generator 124 may be a capacitor C as shown in FIG. 7.

Figure 7:
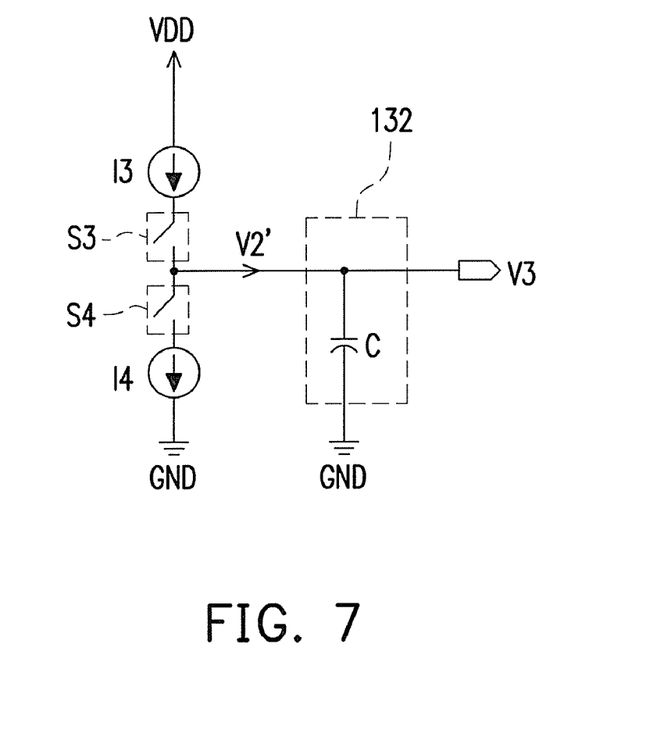
FIG. 7 is a circuit diagram of a dummy load and a part of a current array according to another embodiment of the present invention.

FIG. 7 is a circuit diagram of a dummy load and a part of a current array according to another embodiment of the present invention. As shown in FIG. 7, the dummy load 132 is a capacitor C. One end of the capacitor C is coupled to the current array 130 and the logic circuit 128 to receive the dummy signal V2' from the current array 130 and provide the third signal V3 to the logic circuit 128. The other end of the capacitor C is grounded. Similarly, the implementation of the dummy load 132 of the frequency generator 124 as the capacitor C can obtain the same result as described in the embodiment above in which the dummy load 132 is implemented as the comparator A4 and therefore explanation thereof is not repeated herein.

Figure 8:
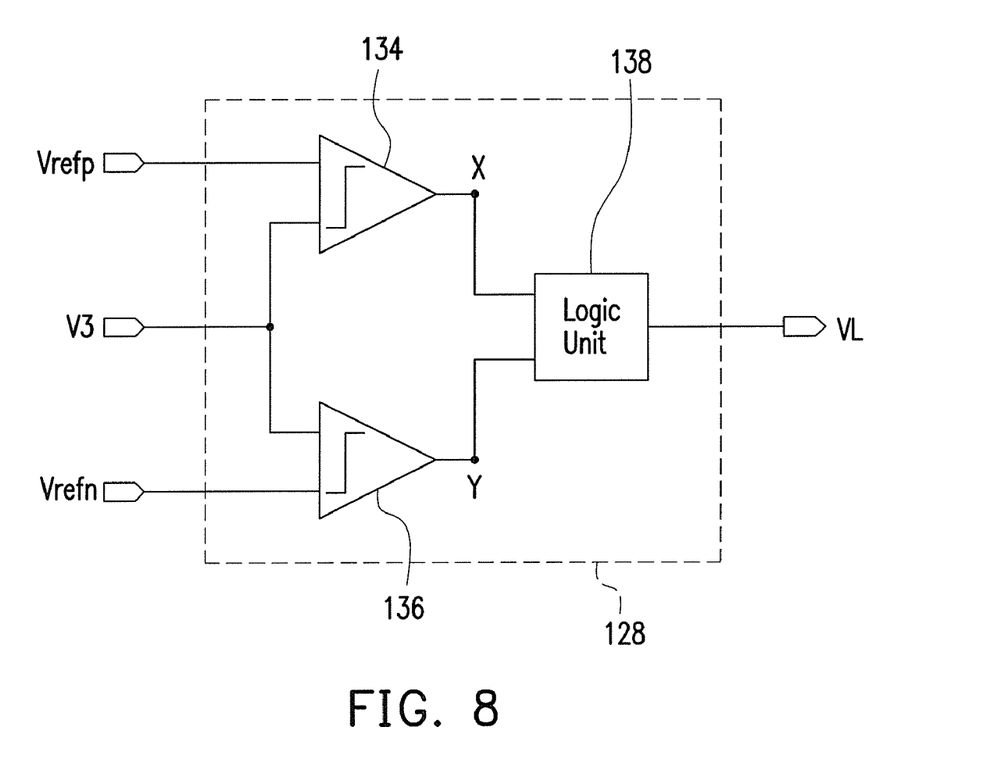
FIG. 8 is a circuit diagram of a logic circuit according to another embodiment of the present invention.
Figure 9:
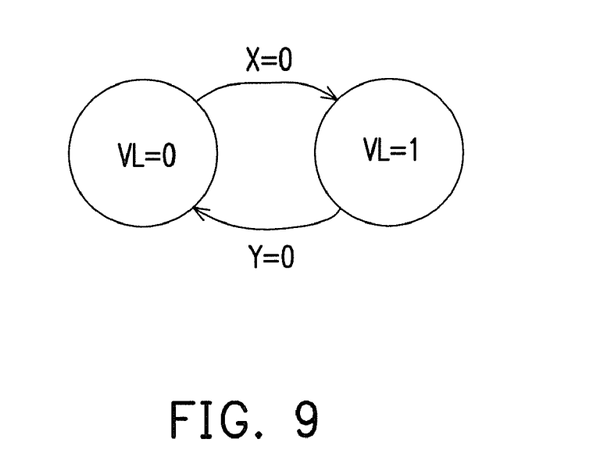
FIG. 9 is a state diagram of the logic signal of the logic circuit of FIG. 8.

FIG. 8 is a circuit diagram of a logic circuit according to another embodiment of the present invention, and FIG. 9 is a state diagram of the logic signal VL of the logic circuit 128 of FIG. 8. Referring to FIGS. 6, 8 and 9, the logic circuit 128 of the present embodiment includes comparators 134 and 136 and a logic unit 138.

Specifically, when the level of the third signal V3 is higher than the level of the reference signal Vrefp, an output X of the comparator 134 is in a low logic level (X=0). On the contrary, when the level of the third signal V3 is lower than the level of the reference signal Vrefp, the output X of the comparator 134 is in a high logic level (X=1). Similarly, when the level of the third signal V3 is higher than the level of the reference signal Vrefn, an output Y of the comparator 136 is in a high logic level (Y=1). On the contrary, when the level of the third signal V3 is lower than the level of the reference signal Vrefn, the output Y of the comparator 136 is in a low logic level (Y=0).

In particular, referring to FIG. 9, when X changes from the logic high level (X=1) to the logic low level (X=0), the logic unit 138 changes the level of the outputted logic signal VL to a logic high level (VL=1) to control the current array 130 to discharge the dummy load 132. On the contrary, when Y changes from the logic high level (Y=1) to the logic low level (Y=0), the logic unit 138 changes the level of the outputted logic signal VL to a logic low level (VL=0) to control the current array 130 to charge the dummy load 132. By repeatedly operating the above, effects can be achieved by the logic circuit 128 as depicted in FIG. 5, and therefore explanation thereof is not repeated.

Figure 10:
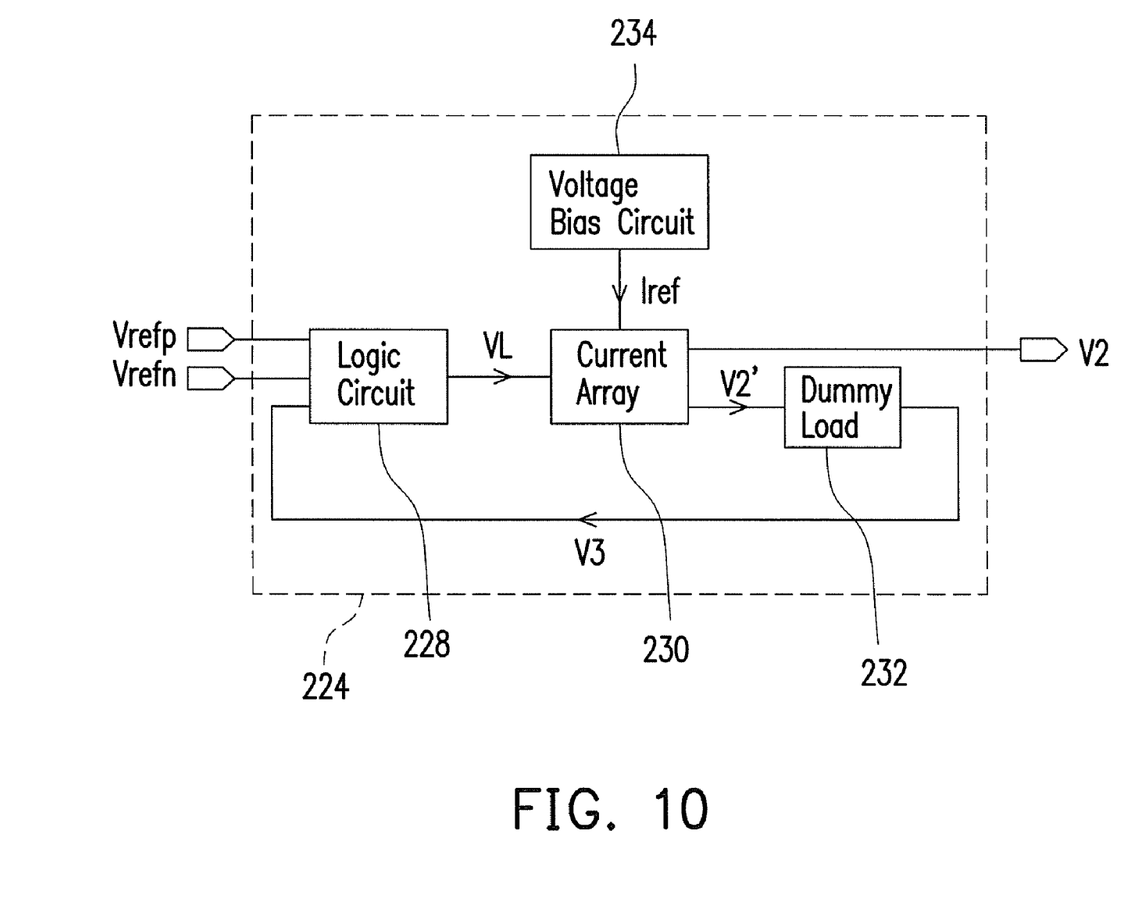
FIG. 10 is a block diagram of a frequency generator according to another embodiment of the present invention.

FIG. 10 is a block diagram of a frequency generator according to another embodiment of the present invention. As shown in FIG. 10, the frequency generator 224 of the present embodiment is similar to the frequency generator 124 of the above embodiment except that the frequency generator 224 further includes a voltage bias circuit 234 for providing a reference current Iref to a current array 230.

Figure 11:
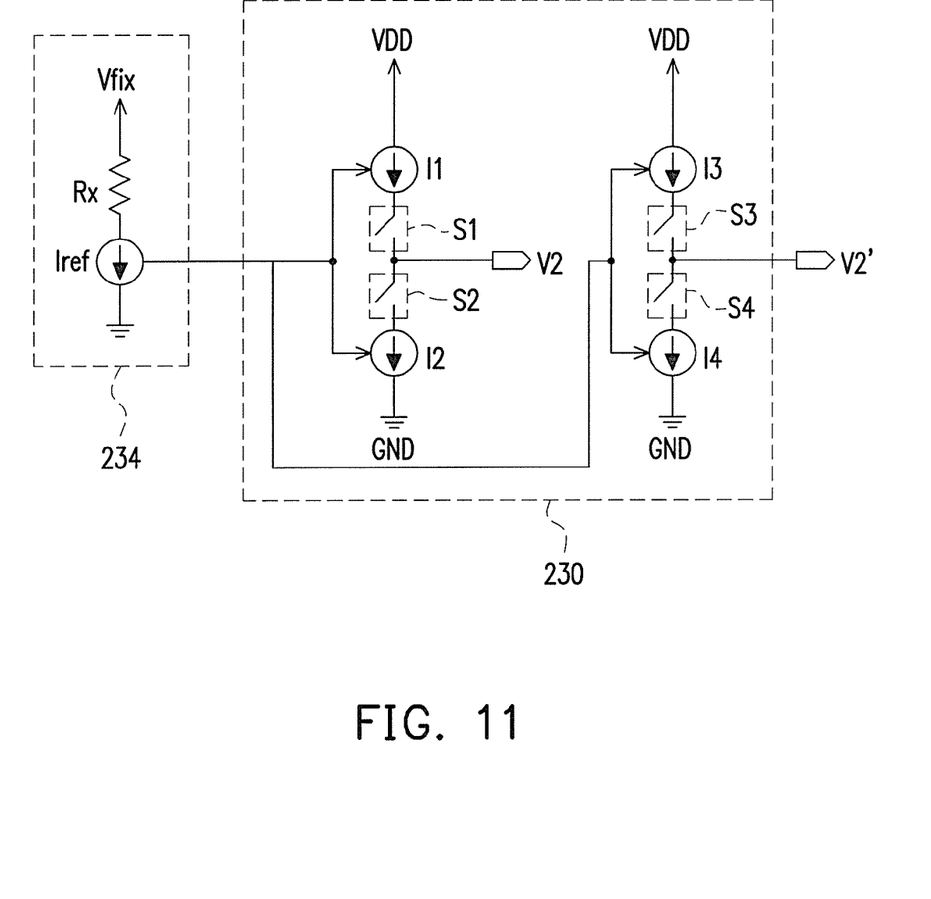
FIG. 11 is a circuit diagram of a current array and a voltage bias circuit according to another embodiment of the present invention.

FIG. 11 is a circuit diagram of a current array and a voltage bias circuit according to another embodiment of the present invention. As shown in FIG. 11, in the present embodiment, a variable resistor Rx is biased by a fixed voltage Vfix to generate a reference current Iref, wherein an equivalent impedance of the variable resistor Rx is proportional to the equivalent impedance of the load circuit of the loop filter 122. As a result, the reference current Iref changes with the equivalent impedance of the loop filter 122 to reduce the impact on the circuit function caused by resistors in the loop filter 122 due to the process variations. In the present embodiment, current sources I1~I4 of the current array 230 copy the reference current Iref by using, for example, a current mirror.

It is to be noted that since $$R \times S = \frac{C}{I}(Vrefp - Vrefn),$$

the frequency generator 224 with the voltage bias circuit 234 can avoid the impact on the coefficients a1, a2, and a3 of the loop filter 122 caused by the resistors in the loop filter 122 due to the process variations and can result in an inversely-proportional relationship between the current I and resistor R, thereby maintaining the coefficients a1, a2, and a3 to be constant and further stabilizing the performance of the loop filter 122.

Figure 12A:
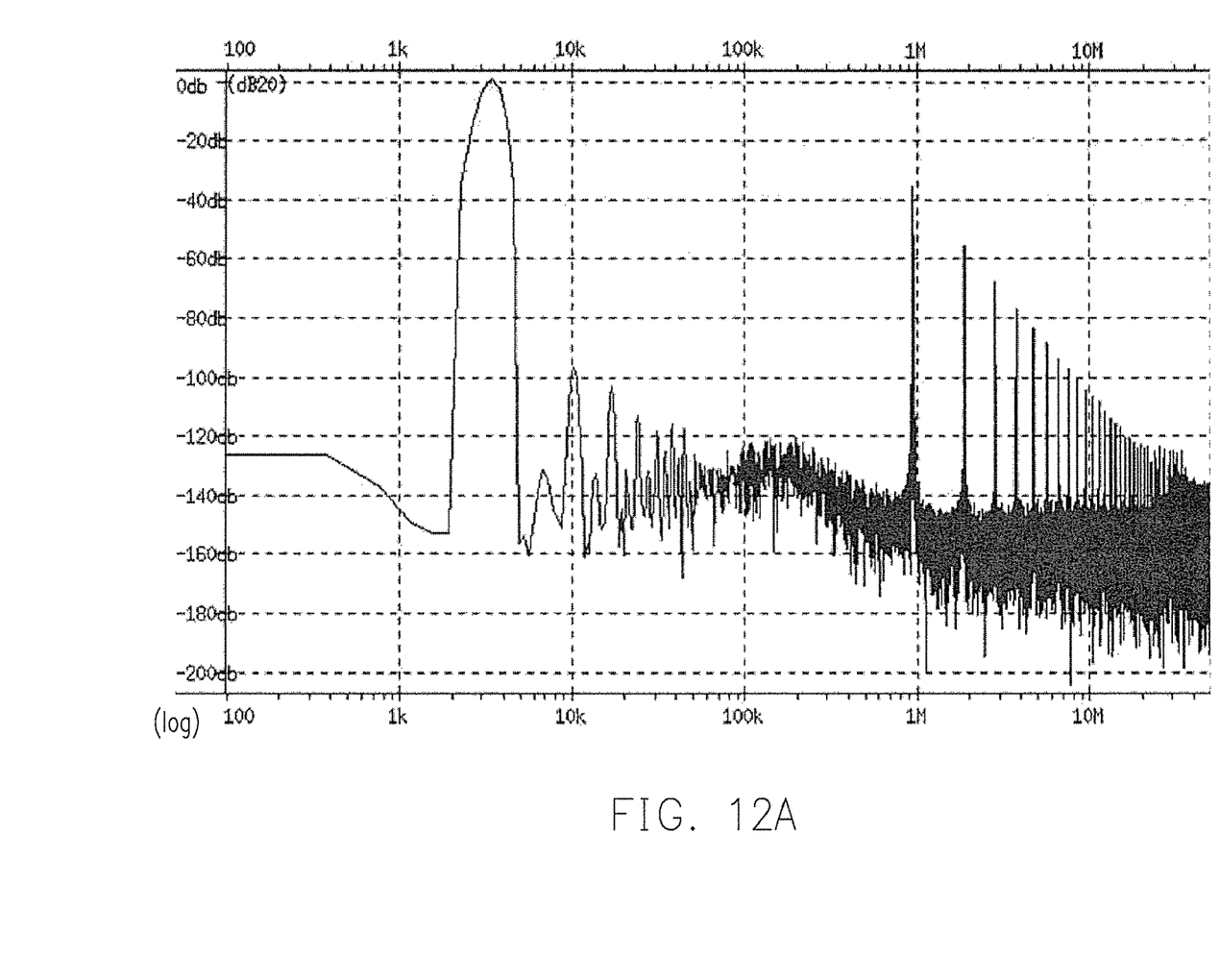
FIGS. 12A~12C illustrate a simulation result of total harmonic distortion plus noise of the power amplifier according to one embodiment of the present invention.
Figure 12B:
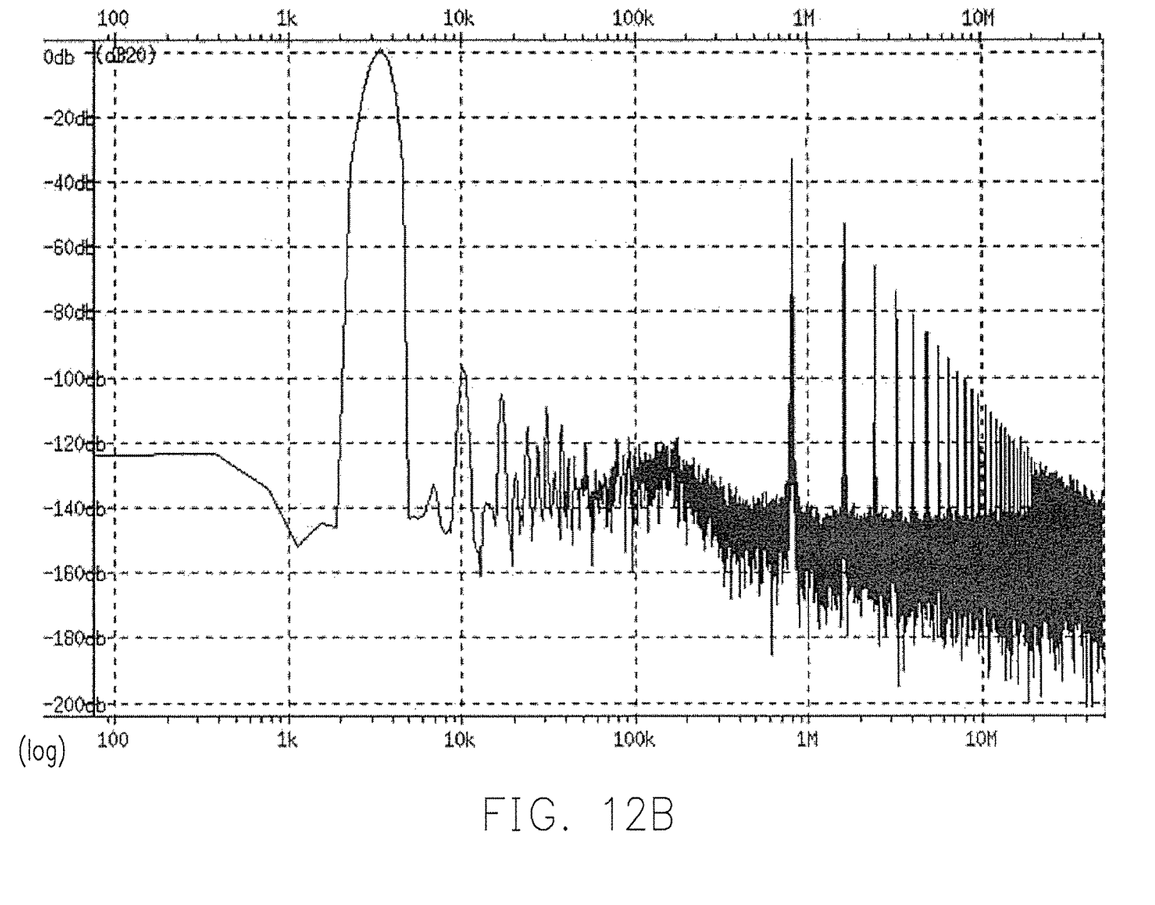
Figure 12C:
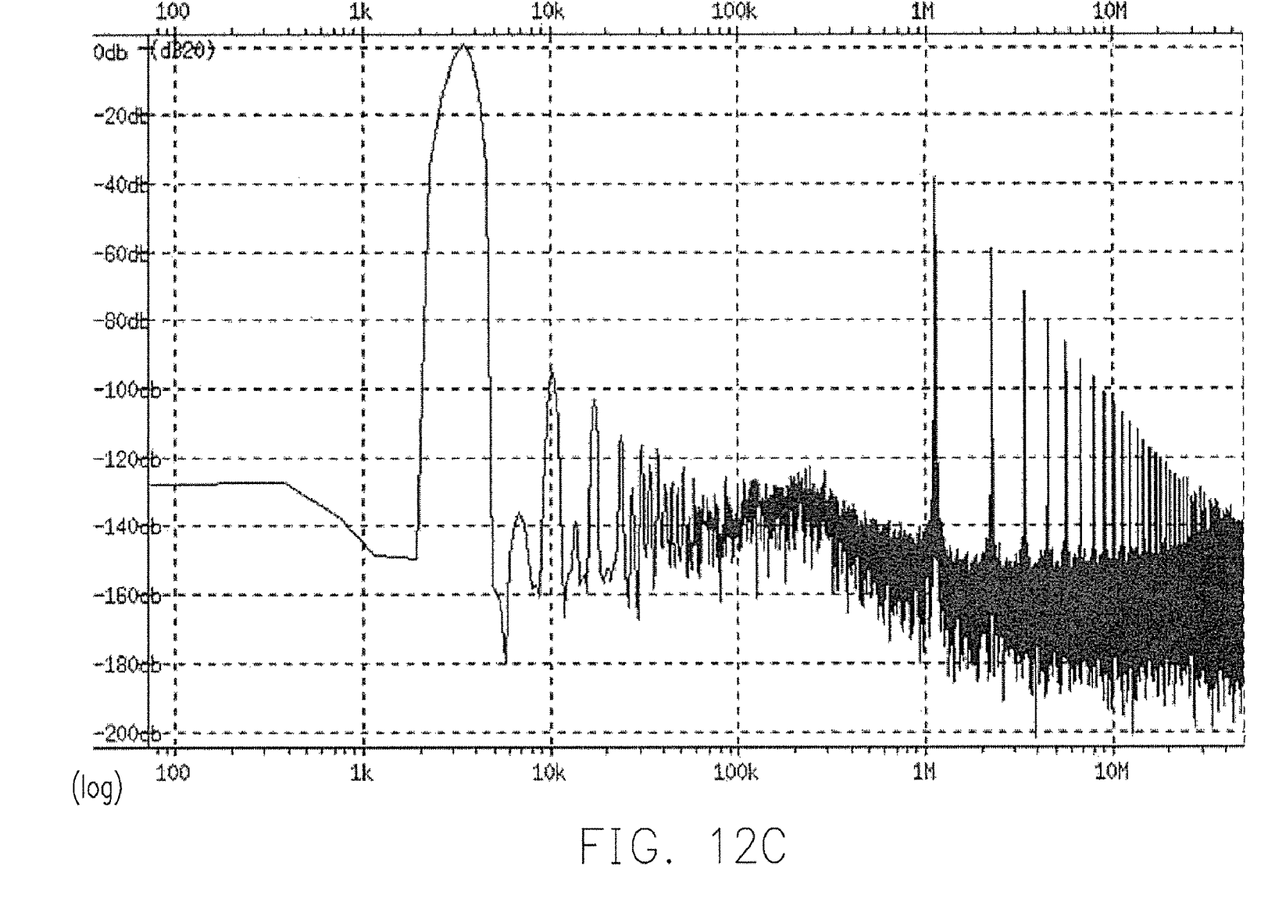

FIGS. 12A~12C illustrate a simulation result of total harmonic distortion plus noise (THD+N) of the power amplifier according to one embodiment of the present invention. Referring to FIGS. 12A~12C, it can be seen from FIG. 12A, THD+N of the power amplifier 100 is equal to 96.59 dB. In the power amplifier 100 of FIG. 12B, the passive components in the loop filter 122 vary during the process. For example, the variation includes as an absolute resistance that is increased by 40% (R+40%) and an absolute capacitance that is increased by 20% (C+20%). It can be seen from FIG. 12B, THD+N of the power amplifier 100 is equal to 96.73 dB. Similarly, in the power amplifier 100 of FIG. 12C, the passive components in the loop filter 122 vary during the process. For example, the variation includes an absolute resistance that is decreased by 40% (R-40%) and an absolute capacitance that is decreased by 20% (C-20%). It can be seen from FIG. 12C, THD+N of the power amplifier 100 is equal to 95.22 dB.

It can be learned from the simulation results of FIG. 12A~12C that in the power amplifiers with an automatic frequency modulation function of the foregoing embodiments, the variation of THD+N can be lowered by 1~2 dB as compared with the existing power amplifiers, thereby effectively improving the output signal quality. In other words, the power amplifiers with an automatic frequency modulation function of the foregoing embodiments can reduce the impact on circuit characteristics caused by the passive components due to the process variations.

In view of the foregoing, the present invention provides a power amplifier with an automatic frequency modulation function and a modulator thereof. In some embodiments, the impact on the power amplifier caused by the capacitor in the loop filter due to the process variations can be reduced by means of operation of the frequency generator. In alternative embodiments, the frequency generator may further include a voltage bias circuit to eliminate the impact on the power amplifier caused by the resistor in the loop filter due to the process variations. Thus, the power amplifier can effectively improve the output signal quality and avoid circuit function failure due to the process variations.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A modulator, comprising:
 a loop filter, for calculating a difference between an input signal and an output signal, accumulating the difference, and generating a first signal according to the difference and a reference frequency;
 a frequency generator, providing a second signal with the reference frequency to the loop filter and comprising:
  a logic circuit, for receiving a third signal, comparing a level of the third signal with a level of a first reference signal or a second reference signal, and outputting a logic signal;
  a current array, coupled to the logic circuit and generating the second signal and a dummy signal according to the logic signal, wherein the second signal and the dummy signal are related to each other; and
  a dummy load, coupled to the current array, the dummy load representing a load circuit of the loop filter, wherein the current array uses the dummy signal to drive the dummy load to provide the third signal to the logic circuit; and
 a quantizer, coupled to the loop filter for quantizing the first signal into a digital signal and outputting the digital signal to a next stage circuit of the modulator.

2. The modulator according to claim 1, wherein an equivalent impedance of the dummy load is proportional to an equivalent impedance of the load circuit.

3. The modulator according to claim 1, wherein the frequency generator further comprises a voltage bias circuit providing a reference current to the current array.

4. The modulator according to claim 3, wherein the voltage bias circuit comprises a variable resistor having one end coupled to a fixed voltage to generate the reference current, and an equivalent impedance of the variable resistor is proportional to an equivalent impedance of the load circuit.

5. The modulator according to claim 1, wherein the current array comprises:
- a first current source, having an input end coupled to a system voltage;
- a first switch, having a first end coupled to an output end of the first current source and a second end coupled to the loop filter;
- a second switch, having a first end coupled to the second end of the first switch;
- a second current source, having an input end coupled to a second end of the second switch and an output end being grounded;
- a third current source, having an input end coupled to the system voltage;
- a third switch, having a first end coupled to an output end of the third current source and a second end coupled to the dummy load;
- a fourth switch, having a first end coupled to the second end of the third switch; and
- a fourth current source, having an input end coupled to a second end of the fourth switch and an output end being grounded,
- wherein whether the first switch, the second switch, the third switch and the fourth switch are switched on is determined upon the logic signal of the logic circuit.

6. The modulator according to claim 1, wherein the dummy load is an integrator outputting the third signal to the logic circuit.

7. The modulator according to claim 1, wherein the dummy load is a capacitor having a first end coupled to the logic circuit and the current array, and a second end of the capacitor is grounded.

8. The modulator according to claim 1, wherein the second signal is a triangle wave.

9. The modulator according to claim 8, wherein the levels of the first reference signal and the second reference signal are equal to maximum and minimum levels of the triangle wave.

10. The modulator according to claim 1, wherein the loop filter comprises:
- a first resistor, having a second end for receiving the input signal;
- a second resistor, having a second end for receiving the output signal;
- a first integrator, having a negative input end coupled to a first end of the first resistor and a first end of the second resistor;
- a third resistor, having a second end coupled to an output end of the first integrator;
- a second integrator, having a negative input end coupled to a first end of the third resistor;
- a fourth resistor, having a second end coupled to an output end of the second integrator;
- a fifth resistor, having a second end coupled to the output end of the first integrator;
- a sixth resistor, having a second end for receiving the output signal; and
- a third integrator, having a negative input end coupled to first ends of the fourth, fifth and sixth resistors.

11. The modulator according to claim 1, wherein the quantizer is a comparator.

12. A power amplifier, comprising:
- a loop filter, for calculating a difference between an input signal and an output signal, accumulating the difference, and generating a first signal according to the difference and a reference frequency;
- a frequency generator, providing a second signal with the reference frequency to the loop filter and comprising:
  - a logic circuit, for receiving a third signal, comparing a level of the third signal with a level of a first reference signal or a second reference signal, and outputting a logic signal;
  - a current array, coupled to the logic circuit and generating the second signal and a dummy signal according to the logic signal, wherein the second signal and the dummy signal are related to each other; and
  - a dummy load, coupled to the current array, the dummy load representing a load circuit of the loop filter, wherein the current array uses the dummy signal to drive the dummy load to provide a third signal to the logic circuit;
- a quantizer, coupled to the loop filter for quantizing the first signal into a digital signal; and
- an output stage module, coupled to the quantizer for receiving the digital signal and generating the corresponding output signal according to a logic level of the digital signal to drive an external load.

13. The power amplifier according to claim 12, wherein an equivalent impedance of the dummy load is proportional to an equivalent impedance of the load circuit.

14. The power amplifier according to claim 12, wherein the frequency generator further comprises a voltage bias circuit providing a reference current to the current array.

15. The power amplifier according to claim 14, wherein the voltage bias circuit comprises a variable resistor having one end coupled to a fixed voltage to generate the reference current, and an equivalent impedance of the variable resistor is proportional to an equivalent impedance of the load circuit.

16. The power amplifier according to claim 12, wherein the current array comprises:
- a first current source, having an input end coupled to a system voltage;
- a first switch, having a first end coupled to an output end of the first current source and a second end coupled to the loop filter;
- a second switch, having a first end coupled to the second end of the first switch;
- a second current source, having an input end coupled to a second end of the second switch and an output end being grounded;
- a third current source, having an input end coupled to the system voltage;
- a third switch, having a first end coupled to an output end of the third current source and a second end coupled to the dummy load;
- a fourth switch, having a first end coupled to the second end of the third switch; and
- a fourth current source, having an input end coupled to a second end of the fourth switch and an output end being grounded,
- wherein whether the first switch, the second switch, the third switch and the fourth switch are switched on is determined upon the logic signal of the logic circuit.

17. The power amplifier according to claim 12, wherein the dummy load is an integrator outputting the third signal to the logic circuit.

18. The power amplifier according to claim 12, wherein the dummy load is a capacitor having a first end coupled to the logic circuit and the current array, and a second end of the capacitor is grounded.

19. The power amplifier according to claim 12, wherein the second signal is a triangle wave.

20. The power amplifier according to claim 19, wherein the levels of the first reference signal and the second reference signal are equal to maximum and minimum levels of the triangle wave.

21. The power amplifier according to claim 12, wherein the loop filter comprises:
 a first resistor, having a second end for receiving the input signal;
 a second resistor, having a second end for receiving the output signal;
 a first integrator, having a negative input end coupled to a first end of the first resistor and a first end of the second resistor;
 a third resistor, having a second end coupled to an output end of the first integrator;
 a second integrator, having a negative input end coupled to a first end of the third resistor;
 a fourth resistor, having a second end coupled to an output end of the second integrator;
 a fifth resistor, having a second end coupled to the output end of the first integrator;
 a sixth resistor, having a second end for receiving the output signal; and
 a third integrator, having a negative input end coupled to first ends of the fourth, fifth and sixth resistors.

22. The power amplifier according to claim 12, wherein the quantizer is a comparator.

* * * * *